(12) United States Patent
Okada et al.

(10) Patent No.: US 12,525,513 B2
(45) Date of Patent: Jan. 13, 2026

(54) CIRCUIT MODULE

(71) Applicant: Murata Manufacturing Co., Ltd., Nagaokakyo (JP)

(72) Inventors: Takanari Okada, Nagaokakyo (JP); Yasutaka Maeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 846 days.

(21) Appl. No.: 17/750,454

(22) Filed: May 23, 2022

(65) Prior Publication Data

US 2022/0399255 A1    Dec. 15, 2022

(30) Foreign Application Priority Data

Jun. 11, 2021    (JP) .................................. 2021-097895

(51) Int. Cl.
  *H01L 23/495*      (2006.01)
  *H05K 1/14*        (2006.01)
  (Continued)

(52) U.S. Cl.
  CPC .. *H01L 23/49541* (2013.01); *H01L 23/49517* (2013.01); *H05K 1/14* (2013.01);
  (Continued)

(58) Field of Classification Search
  CPC ......... H01L 23/49541; H01L 23/49517; H01L 2225/1023; H01L 2225/1064;
  (Continued)

(56) References Cited

U.S. PATENT DOCUMENTS 5,253,010 A * 10/1993 Oku .................... H01L 23/4985
                                              257/E23.125
6,775,153 B2 * 8/2004 Hashimoto ......... H01L 25/0657
                                              257/E23.07
(Continued)

FOREIGN PATENT DOCUMENTS

JP    2002270736 A    9/2002
JP    2010153822 A    7/2010

OTHER PUBLICATIONS

Office Action in JP2021-097895, mailed Dec. 19, 2023, 3 pages.

*Primary Examiner* — William B Partridge
*Assistant Examiner* — Linda J. Fleck
(74) *Attorney, Agent, or Firm* — Keating & Bennett, LLP

(57) ABSTRACT

A circuit module includes a substrate module including an upper main surface with a normal line extending in a vertical direction, an electronic component on the substrate module, and a bonding adhesive fixing the electronic component to the upper main surface. The electronic component includes a first electrode. The substrate module includes a second electrode on the right of the bonding adhesive. The first electrode is electrically connected to the second electrode through solder. A first recess recessed downward and including a bottom is in the upper main surface. An upper end of the second electrode is above the bottom. The first recess includes a first area on the left of a first electrode and overlapping the second electrode when viewed in the lateral direction. A material of the first recess is identical to a material of the upper main surface.

17 Claims, 13 Drawing Sheets

(51) Int. Cl.
  *H05K 1/18* (2006.01)
  *H05K 3/32* (2006.01)
  *H05K 3/34* (2006.01)

(52) U.S. Cl.
  CPC ............. *H05K 1/181* (2013.01); *H05K 3/321* (2013.01); *H05K 3/34* (2013.01)

(58) Field of Classification Search
  CPC ... H01L 2225/107; H01L 25/117; H05K 1/14; H05K 1/181; H05K 3/321; H05K 3/34
  See application file for complete search history.

(56) References Cited

U.S. PATENT DOCUMENTS

| | | | |
|---|---|---|---|
| 9,721,881 B1* | 8/2017 | Gong | ...................... H01L 24/09 |
| 2010/0123256 A1 | 5/2010 | Yoda et al. | |
| 2010/0171207 A1* | 7/2010 | Shen | ...................... H01L 24/97 |
| | | | 438/107 |
| 2010/0270663 A1* | 10/2010 | Johnston | ................. H01L 24/49 |
| | | | 257/E21.705 |
| 2013/0001756 A1 | 1/2013 | Chen et al. | |
| 2016/0056087 A1* | 2/2016 | Wu | ...................... H01L 25/105 |
| | | | 257/738 |
| 2020/0273845 A1* | 8/2020 | Kato | ...................... H01L 24/16 |
| 2025/0062206 A1* | 2/2025 | Marin | ..................... H01L 24/16 |

\* cited by examiner

CIRCUIT MODULE

CROSS REFERENCE TO RELATED APPLICATIONS

This application claims the benefit of priority to Japanese Patent Application No. 2021-097895 filed on Jun. 11, 2021. The entire contents of this application are hereby incorporated herein by reference.

BACKGROUND OF THE INVENTION

1. Field of the Invention

The present invention relates to a circuit module including a substrate module and an electronic component mounted on the substrate module.

2. Description of the Related Art

As an example of an invention relating to a known circuit module, a circuit module described in U.S. Patent Application Publication No. 2013/0001756 (FIG. 2) is known. This circuit module includes a semiconductor package body, an energy storage member, and a shield layer. The semiconductor package body includes a top surface and a conductive element. The conductive element is disposed on the top surface of the semiconductor package body. The energy storage member is disposed on the top surface of the semiconductor package body. The energy storage member and the conductive element of the semiconductor package body are electrically connected to each other through solder. The shield layer is disposed between the semiconductor package body and the energy storage member. At this time, the shield layer is fixed to the semiconductor package body with a bonding adhesive. The shield layer is fixed to the energy storage member with a bonding adhesive.

In the circuit module described in U.S. Patent Application Publication No. 2013/0001756 (FIG. 2), solder and the bonding adhesive may come into contact with each other. More specifically, after the shield layer, the semiconductor package body, and the energy storage member are fixed together with the bonding adhesive, the solder is heated and cooled, and thus allows the energy storage member and the conductive element of the semiconductor package body to be electrically connected to each other therethrough. At this time, the molten solder may spread over the top surface of the semiconductor package body. Thus, the molten solder may come into contact with the bonding adhesive. When the bonding adhesive is electrically conductive, the contact of the solder with the bonding adhesive may cause the circuit module to malfunction. When the bonding adhesive has insulating properties, the heated solder may come into contact with the bonding adhesive, and melt the bonding adhesive with the heat of the solder.

SUMMARY OF THE INVENTION

Preferred embodiments of the present invention provide circuit modules that each prevent solder and a bonding adhesive from coming into contact with each other.

A circuit module according to a preferred embodiment of the present invention includes a substrate module including an upper main surface with a normal line extending in a vertical direction, an electronic component on the substrate module, and a bonding adhesive to fix the electronic component to the upper main surface. The electronic component includes a first electrode. The substrate module includes a second electrode on a side of the bonding adhesive. The first electrode is electrically connected to the second electrode through solder. A first recess recessed downward and including a bottom is provided in the upper main surface. An upper end of the second electrode is located above the bottom. The first recess includes a first area. When viewed in the vertical direction, the first area is located between the second electrode and the bonding adhesive. A material of the first recess is identical to a material of the upper main surface.

Preferred embodiments of the present invention are each able to provide a circuit module that prevents solder and a bonding adhesive from coming into contact with each other.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detailed below with reference to the drawings.

First Preferred Embodiment

Figure 1:
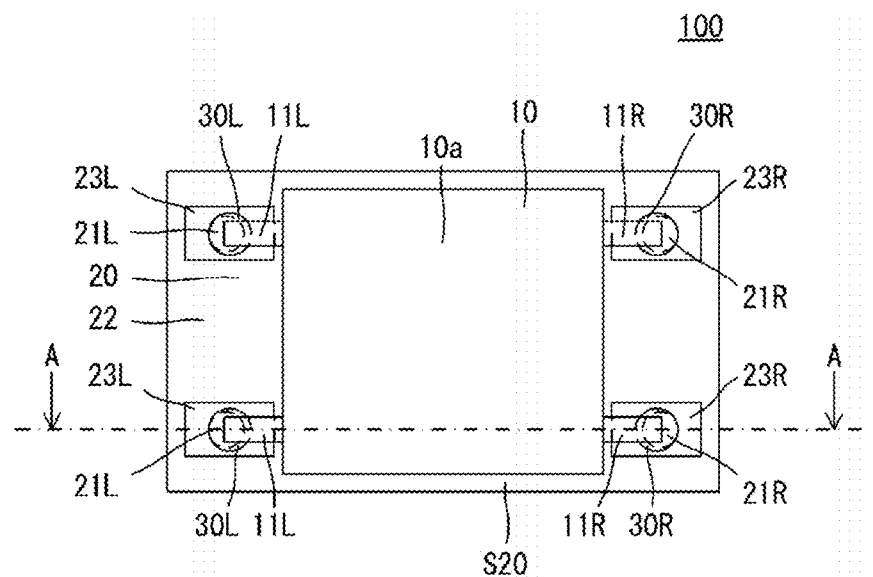
FIG. 1 is a plan view of a circuit module 100 according to a first preferred embodiment of the present invention.
Figure 1:
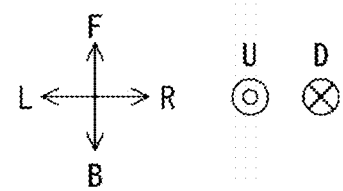
Figure 2:
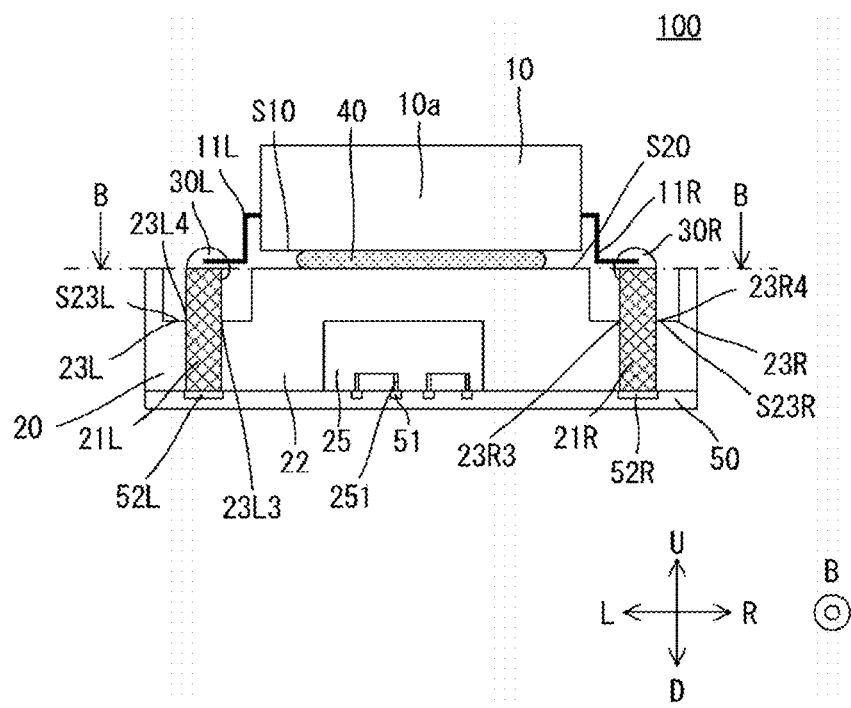
FIG. 2 is a cross-sectional view of the circuit module 100 according to the first preferred embodiment of the present invention taken along line A-A.
Figure 3:
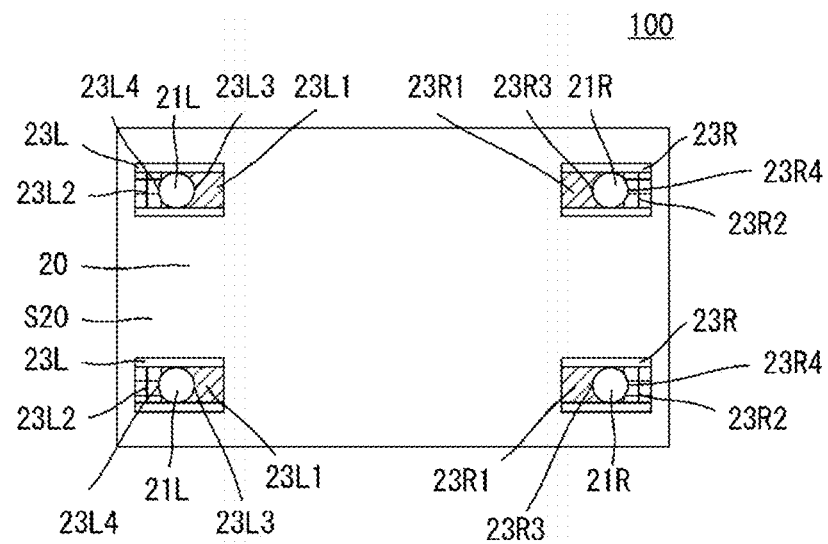
FIG. 3 is a cross-sectional view of the circuit module 100 according to the first preferred embodiment of the present invention taken along line B-B.

A circuit module 100 according to a first preferred embodiment of the present invention will be described with reference to the drawings. FIG. 1 is a plan view of the circuit module 100 according to the first preferred embodiment. FIG. 2 is a cross-sectional view of the circuit module 100 according to the first preferred embodiment taken along line A-A. FIG. 3 is a cross-sectional view of the circuit module 100 according to the first preferred embodiment taken along line B-B.

Herein, the directions are defined as follows. A direction in which a line normal to an upper main surface S20 of a substrate module 20 extends is defined as a vertical direction. The vertical direction coincides with the direction in which an electronic component 10 and the substrate module 20 are arranged. A direction in which second electrodes 21R and second electrodes 21L of the substrate module 20 are arranged is defined as a lateral direction. The direction orthogonal or substantially orthogonal to the vertical direction and the lateral direction is defined as a front-rear direction. The vertical direction, the lateral direction, and the front-rear direction are orthogonal or substantially orthogonal to each other.

Herein, when any two members are defined as a first member and a second member, a state where the first member is disposed on or above the second member refers to the following state. At least a portion of the first member is located immediately on or above the second member. Thus, when viewed in the vertical direction, the first member overlaps the second member. This definition is also applied to the directions other than the vertical direction.

Herein, a state where the first member is disposed on or above the second member includes a state where at least part of the first member is located immediately above the second member and a state where the entirety or substantially the entirety of the first member is located obliquely above the second member. At least a portion or the entirety or substantially the entirety of the first member is located immediately above the second member. Examples of a position obliquely above include an upper left position and an upper right position. This definition is also applied to the direction other than the vertical direction.

Herein, unless otherwise noted, portions of the first member will be defined as follows. A front portion of the first member indicates a front half of the first member. A rear portion of the first member indicates a rear half of the first member. A left portion of the first member indicates a left half of the first member. A right portion of the first member indicates a right half of the first member. An upper portion of the first member indicates an upper half of the first member. A lower portion of the first member indicates a lower half of the first member. A front end of the first member indicates an end of the first member in the front direction. A rear end of the first member indicates an end of the first member in the rear direction. A left end of the first member indicates an end of the first member in the leftward direction. A right end of the first member indicates an end of the first member in the rightward direction. An upper end of the first member indicates an end of the first member in the upward direction. A lower end of the first member indicates an end of the first member in the downward direction. A front end portion of the first member indicates the front end of the first member and the periphery of the end. A rear end portion of the first member indicates the rear end of the first member and the periphery of the end. A left end portion of the first member indicates the left end of the first member and the periphery of the end. A right end portion of the first member indicates the right end of the first member and the periphery of the end. An upper end portion of the first member indicates the upper end of the first member and the periphery of the end. A lower end portion of the first member indicates the lower end of the first member and the periphery of the end.

Herein, the expression that "the first member and the second member are electrically connected to each other" indicates a situation where electricity is conducted between the first member and the second member. Thus, the first member and the second member may be in contact with each other or not in contact with each other. When the first member and the second member are not in contact with each other, a third member that conducts electricity is disposed between the first member and the second member.

As illustrated in FIGS. 1 and 2, the circuit module 100 includes the electronic component 10, the substrate module 20, multiple solder portions 30R, multiple solder portions 30L, and a bonding adhesive 40.

As illustrated in FIGS. 2 and 3, the substrate module 20 includes multiple second electrodes 21R, multiple second electrodes 21L, an insulating sealant 22, an integrated circuit (IC) 25, and a substrate 50.

The substrate 50 has a plate shape including an upper main surface and a lower main surface. The substrate 50 includes an electric circuit defined by a conductor layer inside the substrate 50. As shown in FIG. 2, the substrate 50 includes multiple first conductors 51, multiple second conductors 52R, and multiple second conductors 52L. In FIG. 2, only a typical one of the multiple first conductors 51 is denoted with the reference sign. The multiple first conductors 51, the multiple second conductors 52R, and the multiple second conductors 52L are conductive.

As shown in FIG. 2, the multiple first conductors 51 are arranged in a central portion of the upper main surface of the substrate 50 when viewed in the front-rear direction. The multiple first conductors 51 are electrodes to allow the integrated circuit (IC) 25, described later, to be mounted thereon. The multiple second conductors 52R are linearly arranged in the front-rear direction at the right portion on the upper main surface of the substrate 50. The multiple second conductors 52L are linearly arranged in the front-rear direction at the left portion on the upper main surface of the substrate 50.

As illustrated in FIG. 2, the IC 25 is in contact with the substrate 50 and disposed on the substrate 50. In the present preferred embodiment, the IC 25 is, for example, a power-supply IC. The IC 25 includes electrodes 251. In FIG. 2, only a typical one of the multiple electrodes 251 is denoted with the reference sign. The electrodes 251 are electrically conductive. Bottom surfaces of the electrodes 251 are fixed to the top surfaces of the first conductors 51 with solder.

As illustrated in FIG. 2, the insulating sealant 22 is disposed on the substrate 50. In the present preferred embodiment, the insulating sealant 22 is, for example, resin. The insulating sealant 22 is in contact with the substrate 50, and covers the lower portions of the multiple second electrodes 21R, the lower portions of the multiple second electrodes 21L, and the IC 25. In the present preferred embodiment, the insulating sealant 22 includes an upper main surface S20. In other words, the substrate module 20 includes an upper main surface S20.

As shown in FIGS. 2 and 3, a line normal to the upper main surface S20 extends in the vertical direction. In the present preferred embodiment, a bottom surface S10 of an electronic component body 10a and the upper main surface S20 of the substrate module 20 are arranged in the vertical direction. In other words, as illustrated in FIG. 2, the bottom surface S10 of the electronic component body 10a and the upper main surface S20 of the substrate module 20 oppose each other. In the present preferred embodiment, a material of the upper main surface S20 is the insulating sealant 22.

As illustrated in FIG. 3, multiple first recesses 23R and multiple first recesses 23L are provided in the upper main surface S20. More specifically, the multiple first recesses 23R are linearly arranged from the front to the rear. Each of the multiple first recesses 23L and a corresponding one of the multiple first recesses 23R define a laterally symmetrical structure. Thus, the description of the multiple first recesses 23L will be omitted. In the following description, one of the multiple first recesses 23R is described.

The first recess 23R is provided in the right portion of the upper main surface S20. As illustrated in FIG. 2, the first recess 23R is provided on the right of the bonding adhesive 40, described later. The first recess 23R has a shape recessed downward. In the present preferred embodiment, the first recess 23R has a height difference in the vertical direction from the upper main surface S20. In the present preferred embodiment, a material of the first recess 23R is the insulating sealant 22, which is the same as the material of the portion forming the upper main surface S20. The first recess 23R includes a bottom S23R. More specifically, the bottom S23R is a portion of the first recess 23R located lowest in the vertical direction. In the present preferred embodiment, the bottom S23R is a surface.

As illustrated in FIG. 3, the first recess 23R includes a first area 23R1 and a second area 23R2 that overlap the second electrode 21R when viewed in the lateral direction. More specifically, the first area 23R1 is an area located on the left of the second electrode 21R and where the first recess 23R and the second electrode 21R overlap when viewed in the lateral direction. The first area 23R1 is located between the second electrode 21R and the bonding adhesive 40, described later, when viewed in the vertical direction. The second area 23R2 is an area located on the right of the second electrode 21R and where the first recess 23R and the second electrode 21R overlap when viewed in the lateral direction. The second area 23R2 is located on the right of the second electrode 21R when viewed in the vertical direction. In the present preferred embodiment, the first area 23R1 includes a first portion 23R3 that is in contact with the second electrode 21R when viewed in the vertical direction. In other words, the first recess 23R is in contact with the left portion of the second electrode 21R. The second area 23R2 includes a second portion 23R4 that is in contact with the second electrode 21R when viewed in the vertical direction. In other words, the first recess 23R is in contact with the right portion of the second electrode 21R. As illustrated in FIG. 2, in the present preferred embodiment, the position of the first portion 23R3 in the vertical direction is the same or substantially the same as the position of the second portion 23R4 in the vertical direction.

The multiple second electrodes 21R are disposed at the right portion of the insulating sealant 22. As illustrated in FIG. 2, the multiple second electrodes 21R are disposed on the right of the bonding adhesive 40, described later. More specifically, the multiple second electrodes 21R have a shape extending in the vertical direction, and are electrically conductive. The multiple second electrodes 21R are linearly arranged from the front to the rear, as illustrated in FIG. 3. Each of the multiple second electrodes 21L and a corresponding one of the multiple second electrodes 21R define a laterally symmetrical structure. Thus, the description of the multiple second electrodes 21L will be omitted. In the following description, attention is paid to one of the multiple second electrodes 21R.

The upper end of the second electrode 21R is located above the bottom S23R as illustrated in FIG. 2. In the present preferred embodiment, the second electrode 21R is disposed in the first recess 23R when viewed in the vertical direction. More specifically, the second electrode 21R is in contact with the first recess 23R. The upper end portion of the second electrode 21R is in contact with the corresponding solder portion 30R, described later. The bottom surface of the second electrode 21R is in contact with the top surface of the substrate 50. The bottom surface of the second electrode 21R is fixed to the corresponding second conductor 52R with solder.

As illustrated in FIG. 1, the electronic component 10 includes the electronic component body 10a, multiple first electrodes 11R, and multiple first electrodes 11L. In the present preferred embodiment, the electronic component 10 is, for example, an inductor. As illustrated in FIG. 2, the electronic component 10 is disposed over the substrate module 20.

As illustrated in FIG. 2, the electronic component body 10a includes the bottom surface S10. In the present preferred embodiment, the electronic component body 10a is, for example, cuboid. Instead, the electronic component body 10a may have a shape other than a cuboid as long as the electronic component body 10a has the bottom surface S10.

As illustrated in FIG. 2, the multiple first electrodes 11R are disposed at the right end portion of the electronic component body 10a. More specifically, the multiple first electrodes 11R are metal terminals extending to the lower right from the right surface of the electronic component body 10a. Specifically, the multiple first electrodes 11R are electrically conductive. The right ends of the multiple first electrodes 11R are disposed below the bottom surface S10. As illustrated in FIG. 3, the multiple first electrodes 11R are linearly arranged from the front to the rear. Each of the multiple first electrodes 11L and a corresponding one of the multiple first electrodes 11R define a laterally symmetrical structure. Thus, the multiple first electrodes 11L will not be described below.

The electronic component 10 with the above-described structure is mounted on the substrate module 20 with the bonding adhesive 40, the multiple solder portions 30R, and the multiple solder portions 30L. Specifically, as illustrated in FIG. 2, the bonding adhesive 40 is disposed between the bottom surface S10 of the electronic component body 10a and the upper main surface S20 of the substrate module 20 when viewed in the front-rear direction. The bonding adhesive 40 fixes the electronic component 10 to the upper main surface S20 of the substrate module 20. The bonding adhesive 40 may have conductivity or insulating properties.

As illustrated in FIG. 1, the multiple solder portions 30R are linearly arranged from the front to the rear. The multiple solder portions 30R and the multiple solder portions 30L are meltable when heated. Each of the multiple solder portions 30L and a corresponding one of the multiple solder portions 30R define a laterally symmetrical structure. Thus, the multiple solder portions 30L will not be described. In the following description, attention is paid to one of the multiple solder portions 30R.

As illustrated in FIG. 2, the solder portion 30R is disposed at the lower end portion of the first electrode 11R and the upper end portion of the second electrode 21R. The solder portion 30R is in contact with the lower end portion of the first electrode 11R and the upper end portion of the second electrode 21R. Specifically, the first electrode 11R is electrically connected to the second electrode 21R through the solder portion 30R.

Advantageous Effects

The circuit module 100 is able to prevent the solder portion 30R and the bonding adhesive 40 from coming into contact with each other. More specifically, the bonding adhesive 40 fixes the electronic component 10 to the upper main surface S20. In the upper main surface S20, a first recess 23R is provided on the right of the bonding adhesive 40. The first recess 23R is recessed downward and has the bottom S23R. The upper end of the second electrode 21R is located above the bottom S23R of the first recess 23R. The first recess 23R includes the first area 23R1 located between the second electrode 21R and the bonding adhesive 40 when viewed in the vertical direction. Thus, regardless of when the solder portion 30R disposed at the upper end portion of the second electrode 21R melts and spreads over the upper main surface S20, the molten solder portion 30R flows to the first area 23R1 of the first recess 23R. Thus, the circuit module 100 can prevent the solder portion 30R from spreading to the left of the first recess 23R. Thus, the circuit module 100 can prevent the solder portion 30R and the bonding adhesive 40 from coming into contact with each other.

A material of the first recess 23R is the same as the material of the upper main surface S20. This structure prevents the molten solder portion 30R from damaging the first recess 23R such as, for example, melting the first recess 23R.

The circuit module 100 can increase a creepage distance between one of the second electrodes 21R and a corresponding one of the second electrodes 21L. The creepage distance is the shortest distance between the second electrodes 21R and 21L along the upper main surface S20. Thus, the circuit module 100 can retain excellent insulating performance.

In the circuit module 100, the first recess 23R includes the second area 23R2 located on the right of the second electrode 21R when viewed in the vertical direction. This structure can prevent the solder portion 30R from spreading to the left of the second electrode 21R.

First Modified Example

Figure 4:
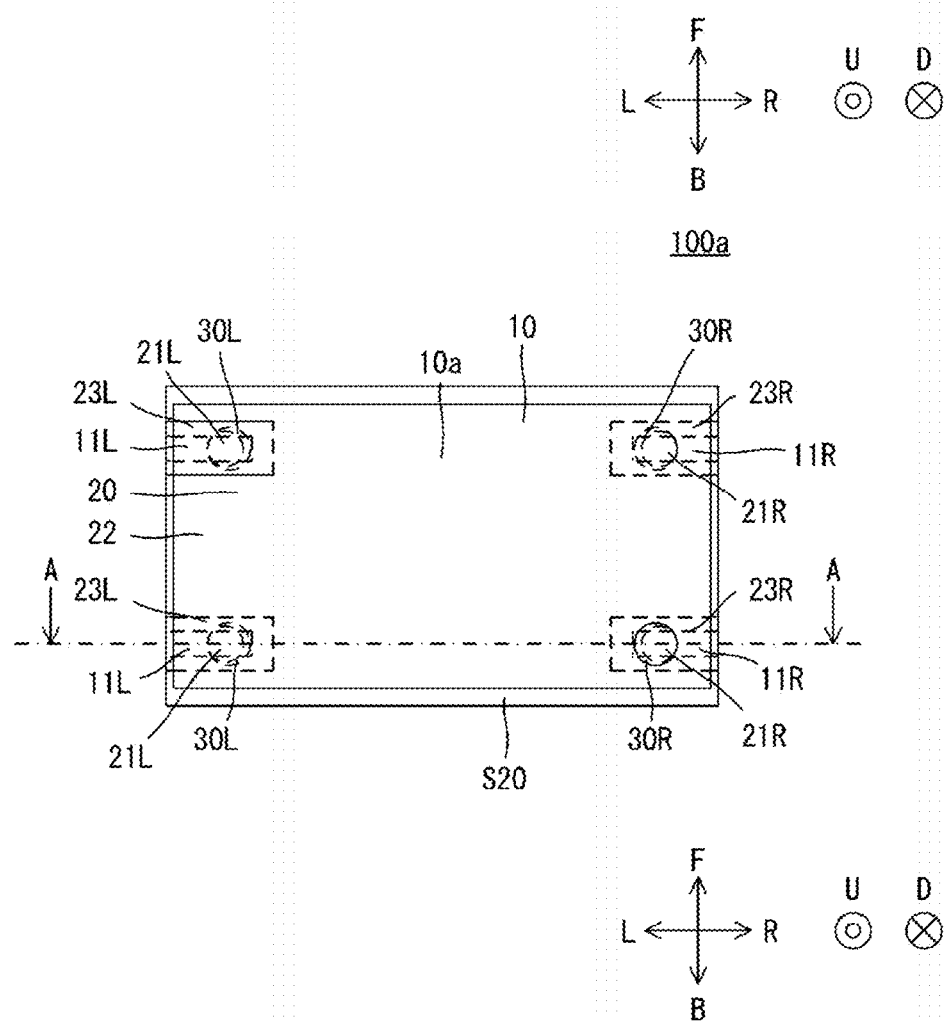
FIG. 4 is a plan view of a circuit module 100a according to a first modified example of a preferred embodiment of the present invention.
Figure 5:
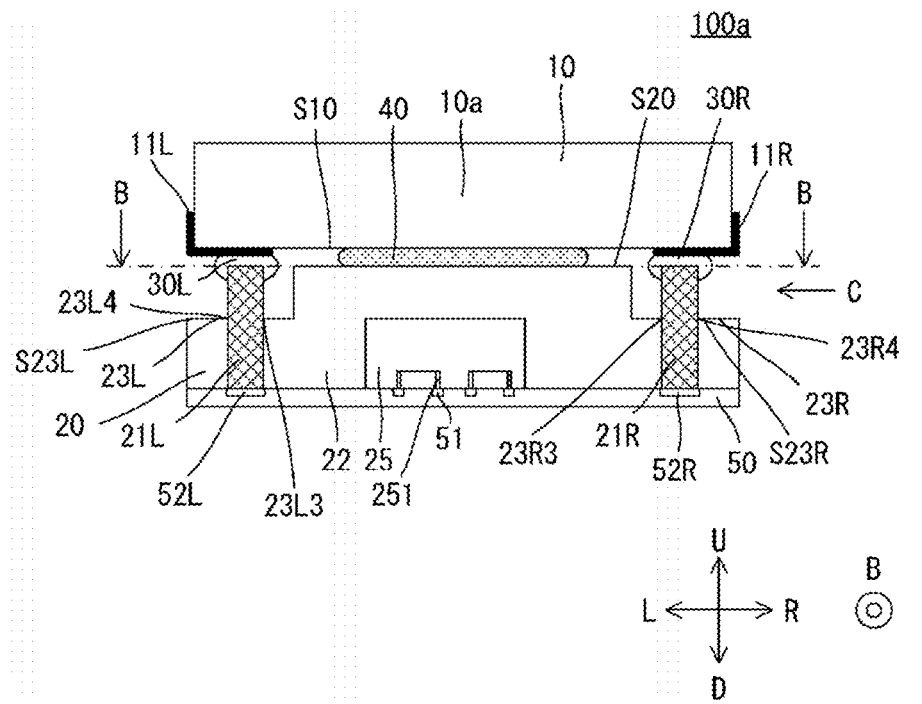
FIG. 5 is a cross-sectional view of the circuit module 100a according to the first modified example taken along line A-A.
Figure 6:
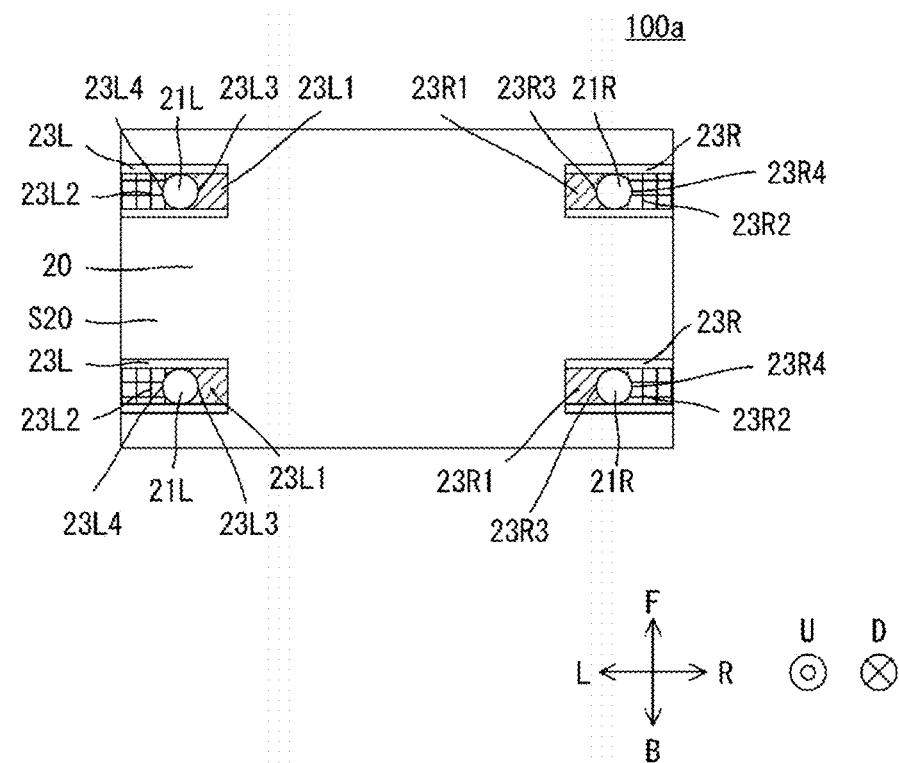
FIG. 6 is a cross-sectional view of the circuit module 100a according to the first modified example taken along line B-B.

A circuit module 100a according to a first modified example of a preferred embodiment of the present invention will be described below with reference to the drawings. FIG. 4 is a plan view of the circuit module 100a according to the first modified example. FIG. 5 is a cross-sectional view of the circuit module 100a according to the first modified example taken along line A-A. FIG. 6 is a cross-sectional view of the circuit module 100a according to the first modified example taken along line B-B. Only the portions of the circuit module 100a according to the first modified example that are different from the corresponding portions of the circuit module 100 according to the first preferred embodiment will be described, and the other portions will not be described.

The circuit module 100a differs from the circuit module 100 in the shape of the first recess 23R, the configuration of the electronic component 10, and the shape of the first electrode 11R.

As illustrated in FIGS. 4 to 6, the right end portion of the first recess 23R extends to the right side of the upper main surface S20.

As illustrated in FIG. 5, the electronic component 10 is disposed above the substrate module 20. The electronic component body 10a includes a portion that overlaps the second electrode 21R when viewed in the vertical direction.

As illustrated in FIG. 5, the first electrode 11R is disposed at the right end portion of the electronic component body 10a. More specifically, the first electrode 11R is a metal terminal extending from the right surface of the electronic component body 10a along the bottom surface S10 of the electronic component body 10a. The first electrode 11R is in contact with the right surface of the electronic component body 10a and the bottom surface S10 of the electronic component body 10a.

The circuit module 100a with the above structure has the same or substantially the same advantageous effects as the circuit module 100. In the circuit module 100a, the adhesion state of the solder portion 30R can be visually inspected when viewed from the right.

Second Modified Example

Figure 7:
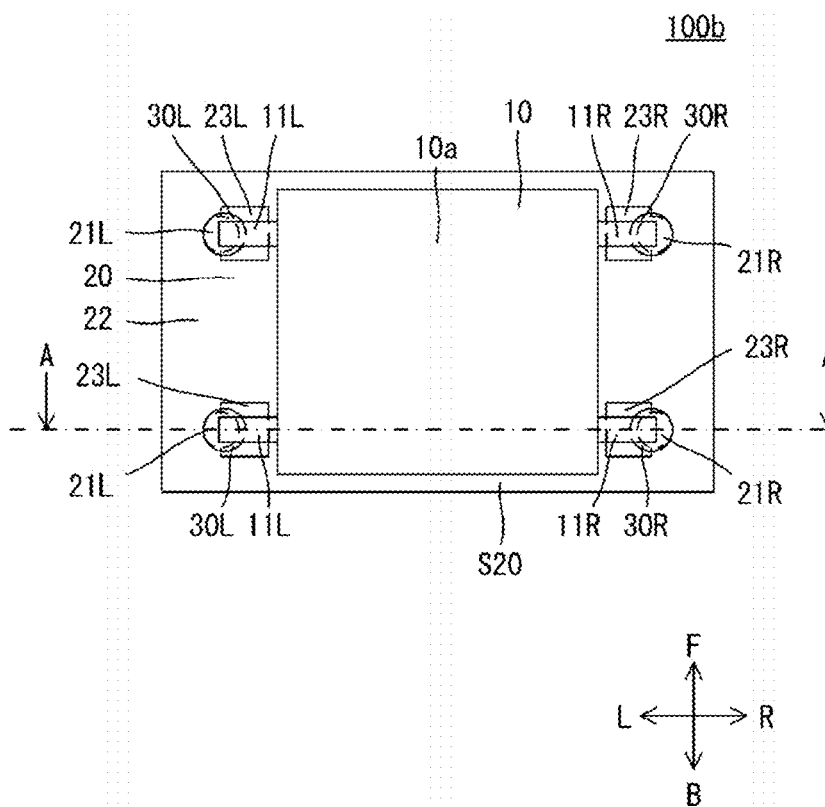
FIG. 7 is a plan view of a circuit module 100b according to a second modified example of a preferred embodiment of the present invention.
Figure 8:
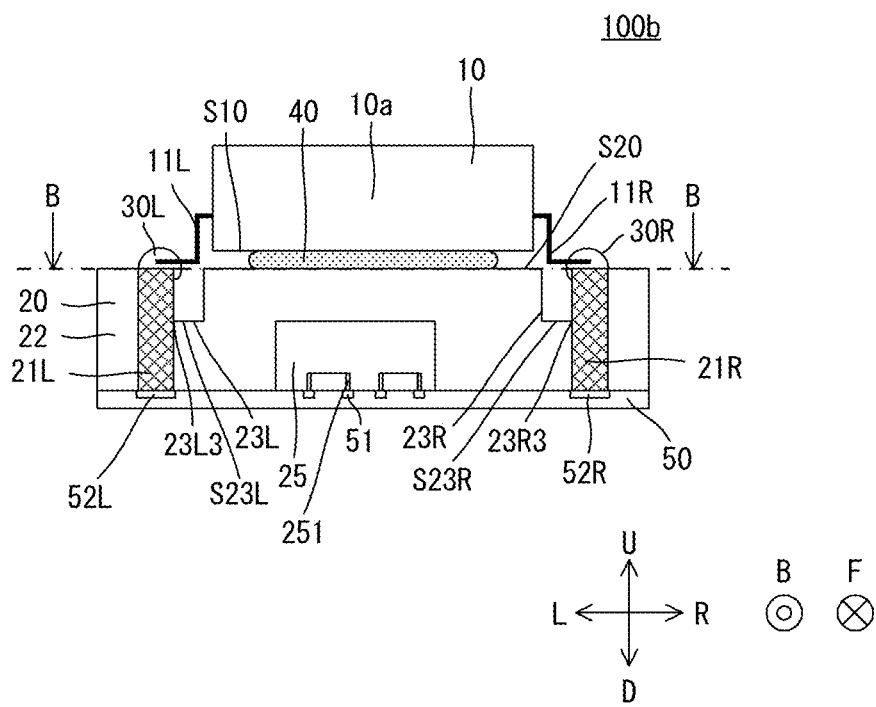
FIG. 8 is a cross-sectional view of the circuit module 100b according to the second modified example taken along line A-A.
Figure 9:
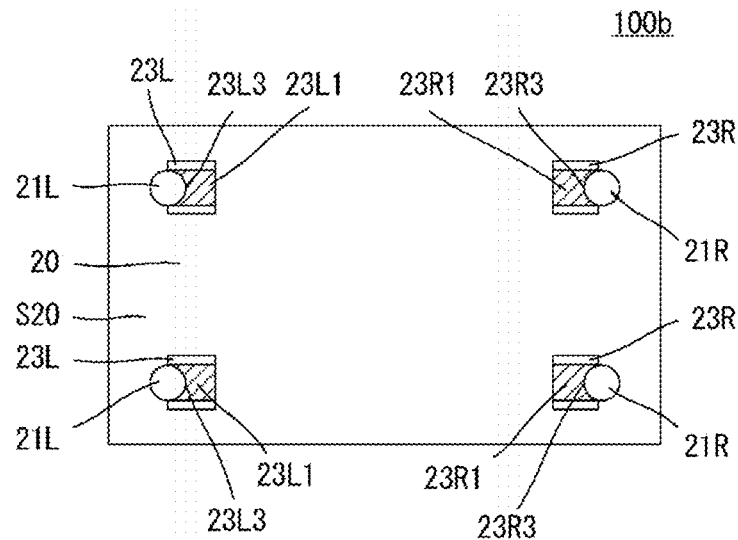
FIG. 9 is a cross-sectional view of the circuit module 100b according to the second modified example taken along line B-B.

A circuit module 100b according to a second modified example of a preferred embodiment of the present invention will be described below with reference to the drawings. FIG. 7 is a plan view of the circuit module 100b according to the second modified example. FIG. 8 is a cross-sectional view of the circuit module 100b according to the second modified example taken along line A-A. FIG. 9 is a cross-sectional view of the circuit module 100b according to the second modified example taken along line B-B. Only the portions of the circuit module 100b according to the second modified example that are different from the corresponding portions of the circuit module 100 according to the first preferred embodiment will be described, and the other portions will not be described.

The circuit module 100b differs from the circuit module 100 in the shape of the first recess 23R. More specifically, as illustrated in FIGS. 7 to 9, the first recess 23R is provided on the left of the second electrode 21R. Thus, the first recess 23R does not include the second area 23R2, as illustrated in FIG. 9.

The circuit module 100b with the above structure can also prevent the solder portion 30R and the bonding adhesive 40 from coming into contact with each other. The circuit module 100b can also increase the creepage distance between the second electrodes 21R and 21L.

Third Modified Example

Figure 10:
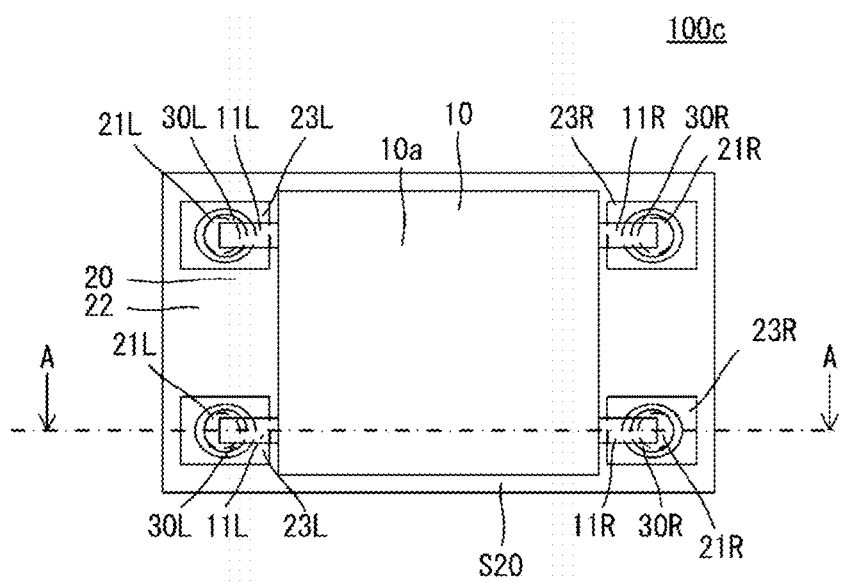
FIG. 10 is a plan view of a circuit module 100c according to a third modified example of a preferred embodiment of the present invention.
Figure 11:
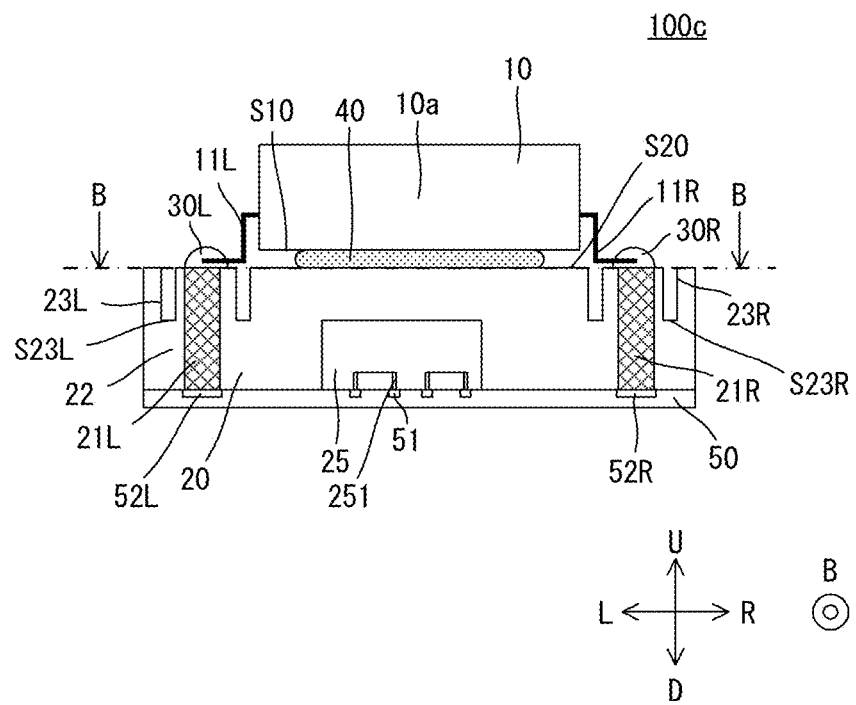
FIG. 11 is a cross-sectional view of the circuit module 100c according to the third modified example taken along line A-A.
Figure 12:
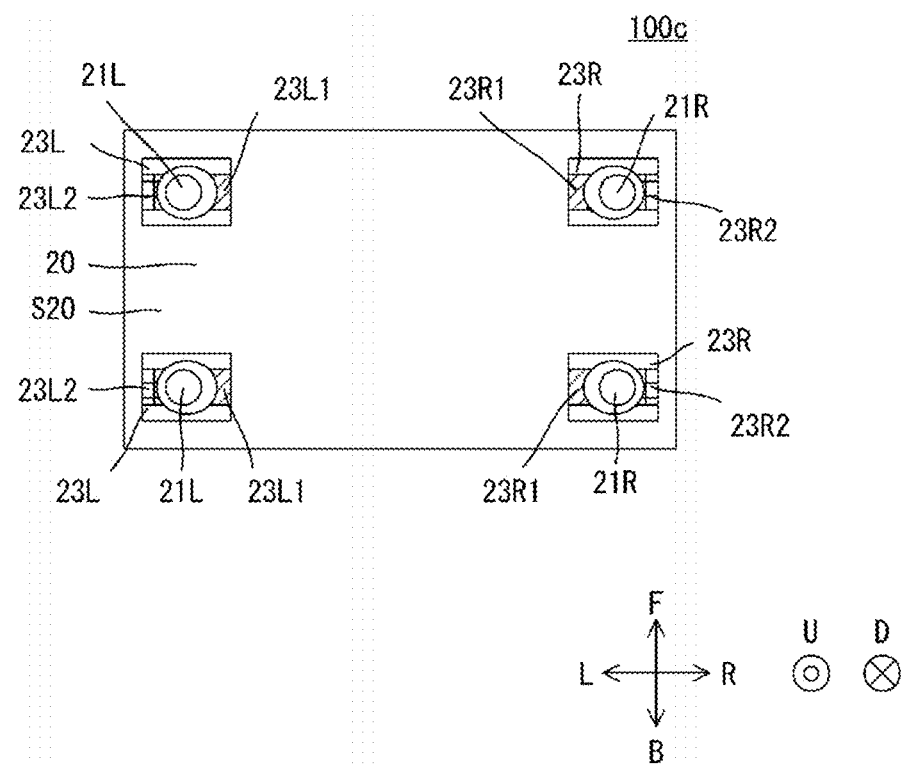
FIG. 12 is a cross-sectional view of the circuit module 100c according to the third modified example taken along line B-B.

A circuit module 100c according to a third modified example of a preferred embodiment of the present invention will be described below with reference to the drawings. FIG. 10 is a plan view of the circuit module 100c according to the third modified example. FIG. 11 is a cross-sectional view of the circuit module 100c according to the third modified example taken along line A-A. FIG. 12 is a cross-sectional view of the circuit module 100c according to the third modified example taken along line B-B. Only the portions of the circuit module 100c according to the third modified example that are different from the corresponding portions of the circuit module 100 according to the first preferred embodiment will be described, and the other portions will not be described.

The circuit module 100c differs from the circuit module 100 in the configuration of the first recess 23R. More specifically, as illustrated in FIGS. 10 to 12, the second electrode 21R is not in contact with the first recess 23R. Specifically, the first area 23R1 does not include the first portion 23R3 that is in contact with the second electrode 21R when viewed in the vertical direction. Thus, as illustrated in FIG. 12, the first area 23R1 is spaced apart from the second electrode 21R in the lateral direction. The second area 23R2 does not include the second portion 23R4 that is in contact with the second electrode 21R when viewed in the vertical direction. Thus, the second area 23R2 is spaced apart from the second electrode 21R in the lateral direction.

The circuit module 100c with the above structure can also prevent the solder portion 30R and the bonding adhesive 40 from coming into contact with each other. The circuit module 100c can also increase the creepage distance between the second electrodes 21R and 21L.

Fourth Modified Example

Figure 13:
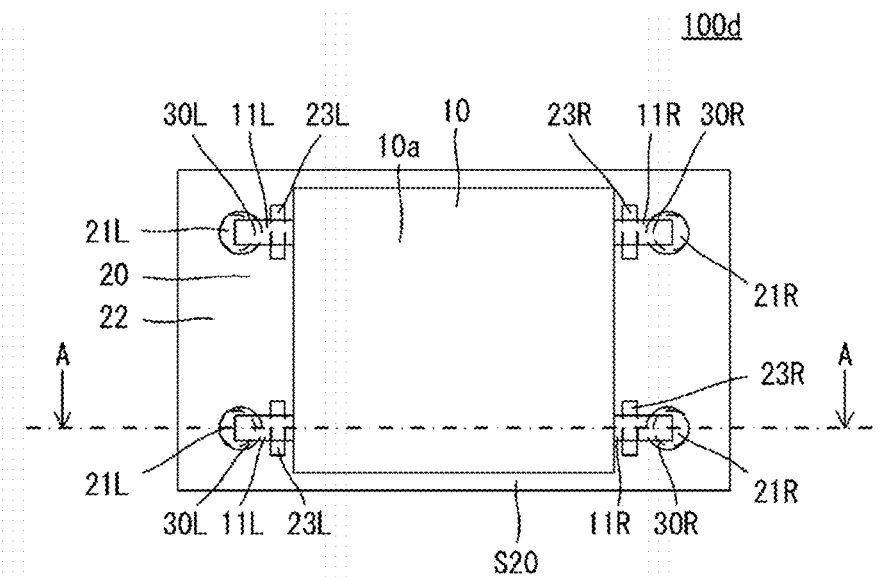
FIG. 13 is a plan view of a circuit module 100d according to a fourth modified example of a preferred embodiment of the present invention.
Figure 13:
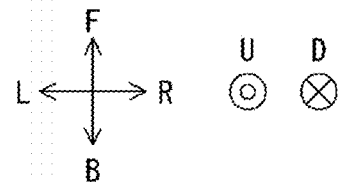
Figure 14:
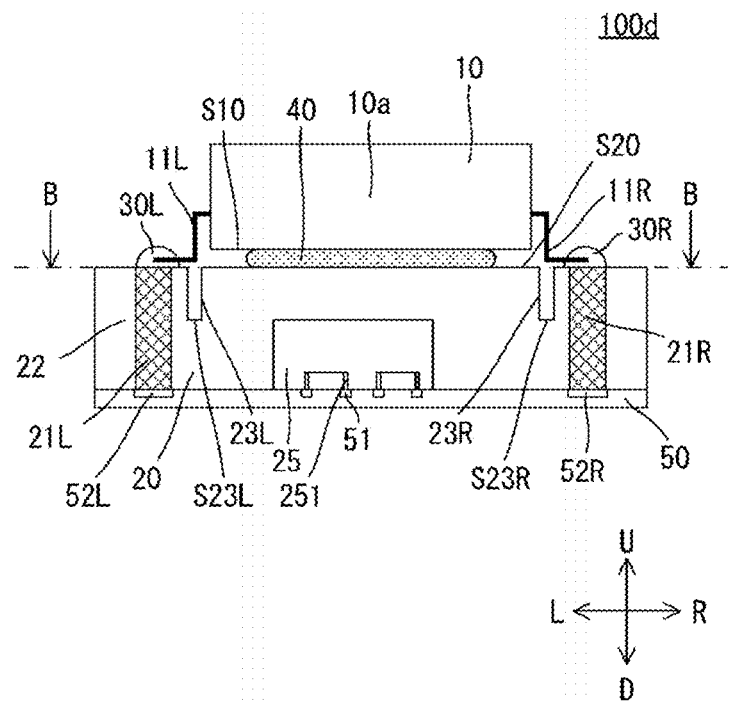
FIG. 14 is a cross-sectional view of the circuit module 100d according to the fourth modified example taken along line A-A.
Figure 14:
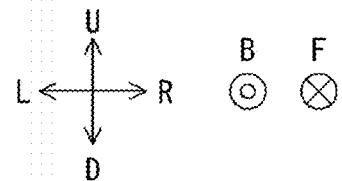
Figure 15:
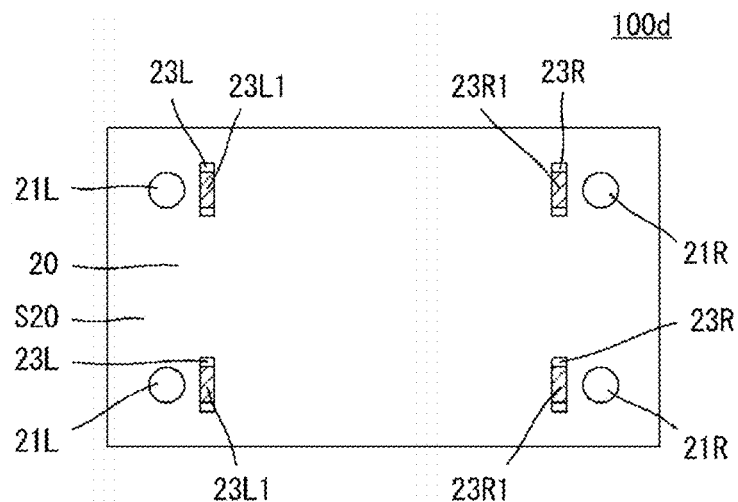
FIG. 15 is a cross-sectional view of the circuit module 100d according to the fourth modified example taken along line B-B.

A circuit module 100d according to a fourth modified example of a preferred embodiment of the present invention will be described with reference to the drawings. FIG. 13 is a plan view of the circuit module 100d according to the fourth modified example. FIG. 14 is a cross-sectional view of the circuit module 100d according to the fourth modified example taken along line A-A. FIG. 15 is a cross-sectional view of the circuit module 100d according to the fourth modified example taken along line B-B. Only the portions of the circuit module 100d according to the fourth modified example that are different from the corresponding portions of the circuit module 100 according to the first preferred embodiment will be described, and the other portions will not be described.

The circuit module 100d differs from the circuit module 100 in the configuration of the first recess 23R. More specifically, as illustrated in FIGS. 13 to 15, the first recess 23R is provided on the left of the second electrode 21R. Thus, as illustrated in FIG. 15, the first recess 23R does not include the second area 23R2. The second electrode 21R is not in contact with the first recess 23R. Specifically, the first area 23R1 does not include the first portion 23R3 that is in contact with the second electrode 21R when viewed in the vertical direction. Thus, as illustrated in FIG. 15, the first area 23R1 is spaced apart from the second electrode 21R in the lateral direction.

The circuit module 100d with the above structure can also prevent the solder portion 30R and the bonding adhesive 40 from coming into contact with each other. The circuit module 100d can also increase the creepage distance between the second electrodes 21R and 21L.

Fifth Modified Example

Figure 16:
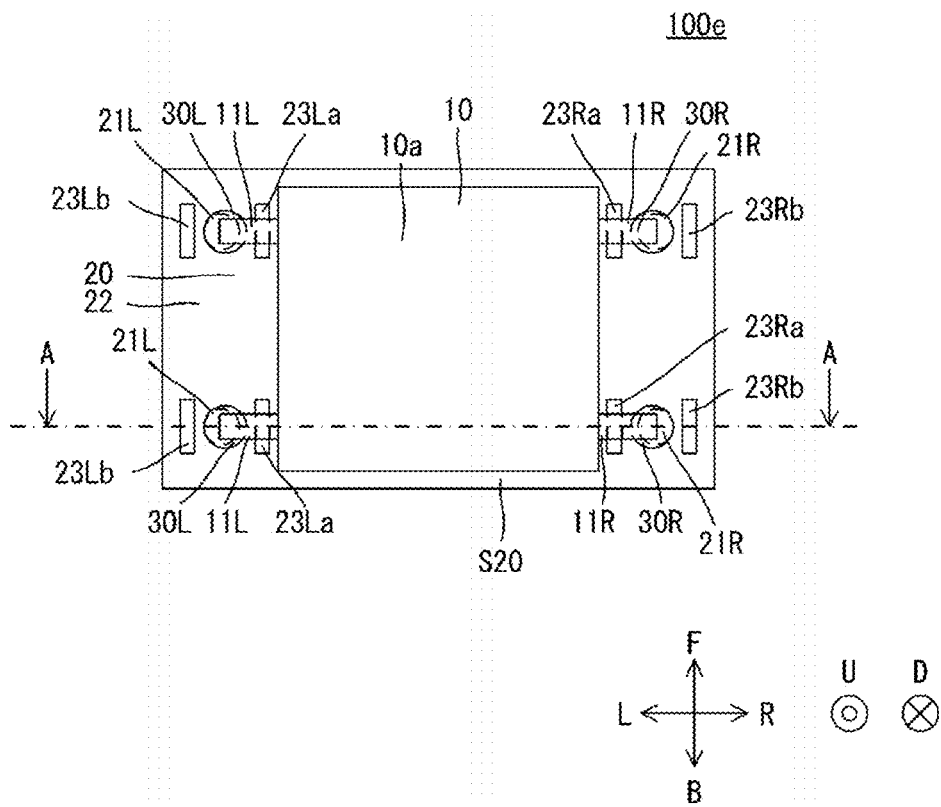
FIG. 16 is a plan view of a circuit module 100e according to a fifth modified example of a preferred embodiment of the present invention.
Figure 17:
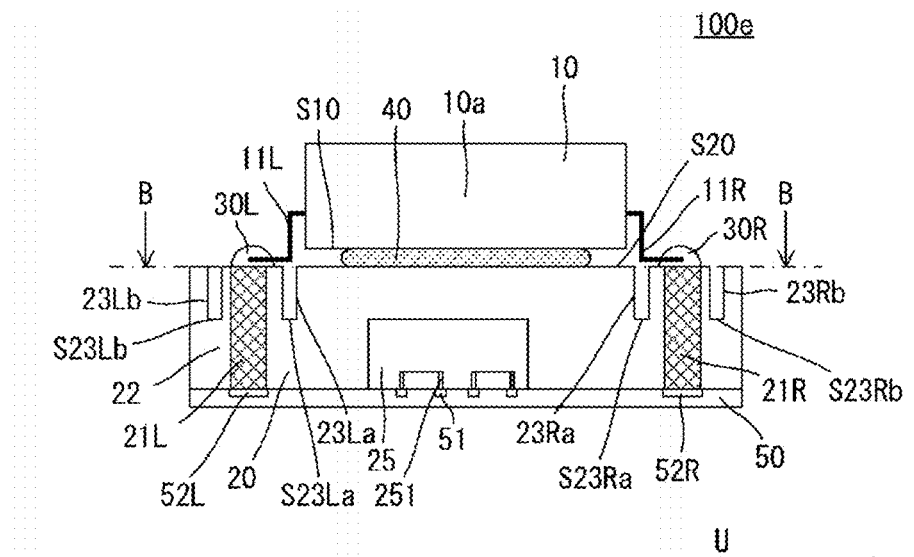
FIG. 17 is a cross-sectional view of the circuit module 100e according to the fifth modified example taken along line A-A.
Figure 18:
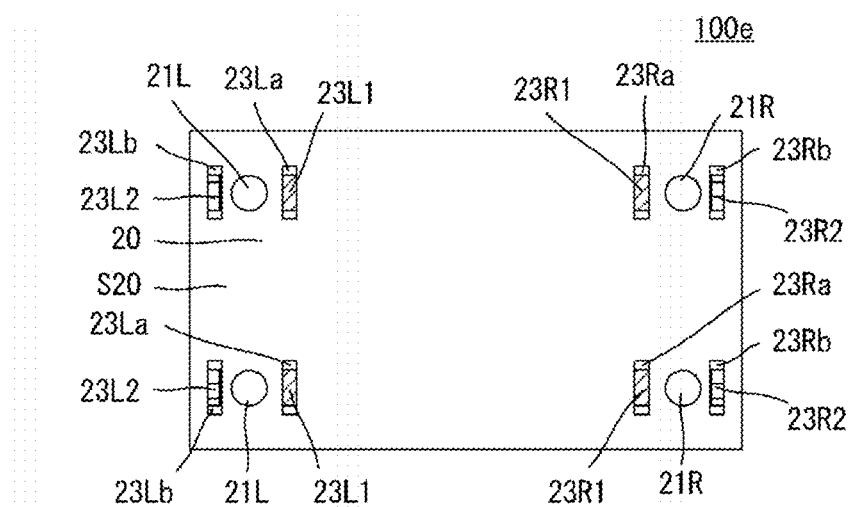
FIG. 18 is a cross-sectional view of the circuit module 100e according to the fifth modified example taken along line B-B.

A circuit module 100e according to a fifth modified example of a preferred embodiment of the present invention will be described below with reference to the drawings. FIG. 16 is a plan view of the circuit module 100e according to the fifth modified example. FIG. 17 is a cross-sectional view of the circuit module 100e according to the fifth modified example taken along line A-A. FIG. 18 is a cross-sectional view of the circuit module 100e according to the fifth modified example taken along line B-B. Only the portions of the circuit module 100e according to the fifth modified example that are different from the corresponding portions of the circuit module 100 according to the first preferred embodiment will be described, and the other portions will not be described.

The circuit module 100e differs from the circuit module 100 in that the first recess 23R is divided into a first recess 23Ra and a second recess 23Rb. More specifically, as illustrated in FIGS. 16 to 18, the first recess 23Ra is provided on the left of the second electrode 21R. Thus, as illustrated in FIG. 18, the first recess 23Ra includes the first area 23R1. In the present modified example, the second electrode 21R is not in contact with the first recess 23Ra. Specifically, the first area 23R1 does not include the first portion 23R3 that is in contact with the second electrode 21R when viewed in the vertical direction. Thus, as illustrated in FIG. 18, the first area 23R1 is spaced apart from the second electrode 21R in the lateral direction.

As illustrated in FIGS. 16 to 18, the second recess 23Rb is provided in the right portion of the upper main surface S20. As illustrated in FIG. 17, the second recess 23Rb has a shape recessed downward. In the present modified example, the second recess 23Rb has a height difference in the vertical direction from the upper main surface S20. In the present modified example, a material of the second recess 23Rb is the insulating sealant 22, and is the same as a material of the upper main surface S20. As illustrated in FIG. 17, the second recess 23Rb has a bottom S23Rb. More specifically, the bottom S23Rb is located at the lowest position of the second recess 23Rb in the vertical direction. In the present modified example, the bottom S23Rb is a surface. The second recess 23Rb is provided on the right of the second electrode 21R. Thus, as illustrated in FIG. 18, the second recess 23Rb includes the second area 23R2. In the present modified example, the second area 23R2 is located on the right of the second electrode 21R and where the second recess 23Rb and the second electrode 21R overlap when viewed in the lateral direction. The second area 23R2 is located on the right of the second electrode 21R when viewed in the vertical direction. In the present modified example, the second electrode 21R is not in contact with the second recess 23Rb. Specifically, the second area 23R2 does not include the second portion 23R4 that is in contact with the second electrode 21R when viewed in the vertical direction. Thus, as illustrated in FIG. 18, the second area 23R2 is spaced apart from the second electrode 21R in the lateral direction.

The circuit module 100e with the above structure also provides the same or substantially the same advantageous effects as the circuit module 100c.

Sixth Modified Example

Figure 19:
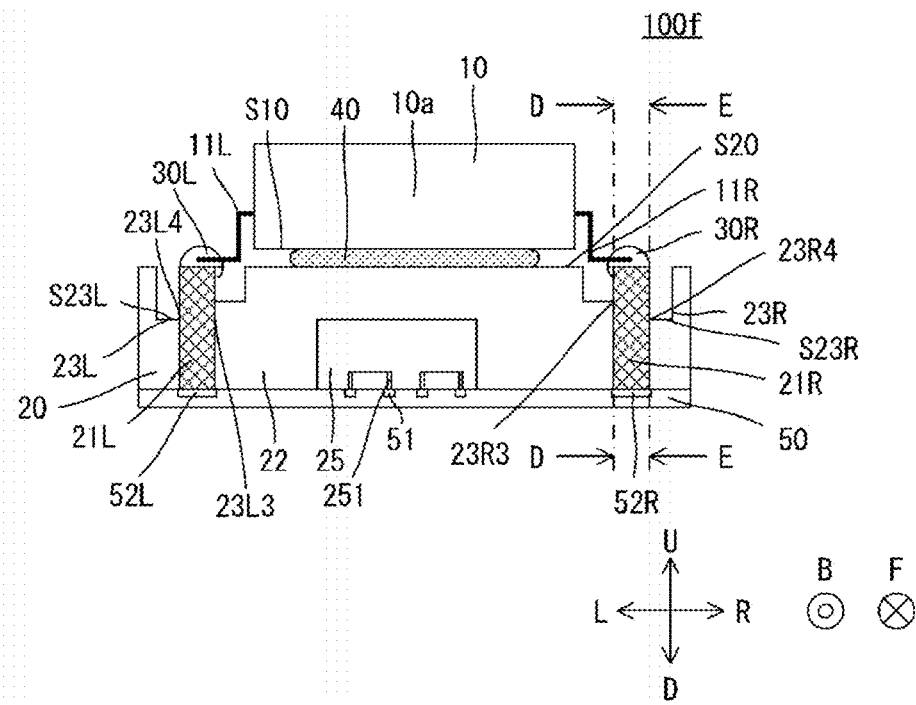
FIG. 19 is a cross-sectional view of a circuit module 100f according to a sixth modified example of a preferred embodiment of the present invention taken along line A-A.
Figure 20:
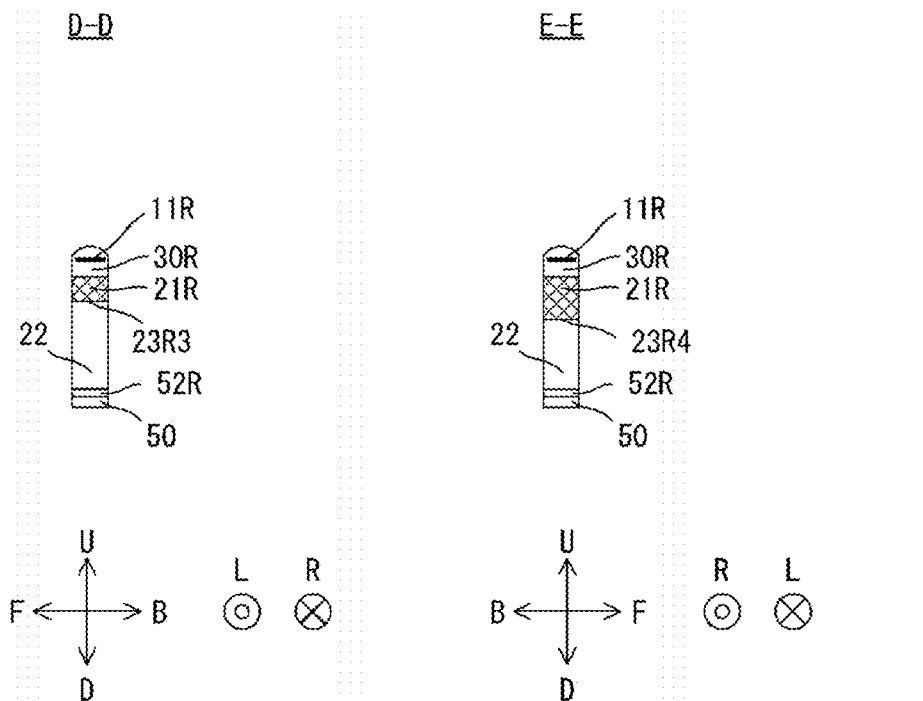
FIG. 20 includes cross-sectional views of the circuit module 100f according to the sixth modified example taken along lines D-D and E-E.

A circuit module 100f according to a sixth modified example of a preferred embodiment of the present invention will be described below with reference to the drawings. FIG. 19 is a cross-sectional view of the circuit module 100f according to the sixth modified example taken along line A-A. FIG. 20 includes cross-sectional views of the circuit module 100f according to the sixth modified example taken along lines D-D and E-E. Only the portions of the circuit module 100f according to the sixth modified example that are different from the corresponding portions of the circuit module 100 according to the first preferred embodiment will be described, and the other portions will not be described.

The circuit module 100f differs from the circuit module 100 in the shape of the first recess 23R. More specifically, as illustrated in FIG. 19, the position of the first portion 23R3 in the vertical direction is above the position of the second portion 23R4 in the vertical direction. In the present modified example, as illustrated in FIG. 20, the position of the first portion 23R3 in the vertical direction and the position of the second portion 23R4 in the vertical direction are the same or substantially the same, but may be different. When the height of the first portion 23R3 in the vertical direction and the height of the second portion 23R4 in the vertical direction are different, the position of the upper end of the first portion 23R3 in the vertical direction may be above the position of the upper end of the second portion 23R4 in the vertical direction, or the position of a certain point of the first portion 23R3 in the vertical direction may be above the position of a certain point of the second portion 23R4 in the vertical direction.

The circuit module 100f with the above structure also has the same or substantially the same advantageous effects as the circuit module 100. The circuit module 100f further prevents the solder portion 30R from spreading to the left of the second electrode 21R.

Seventh Modified Example

Figure 21:
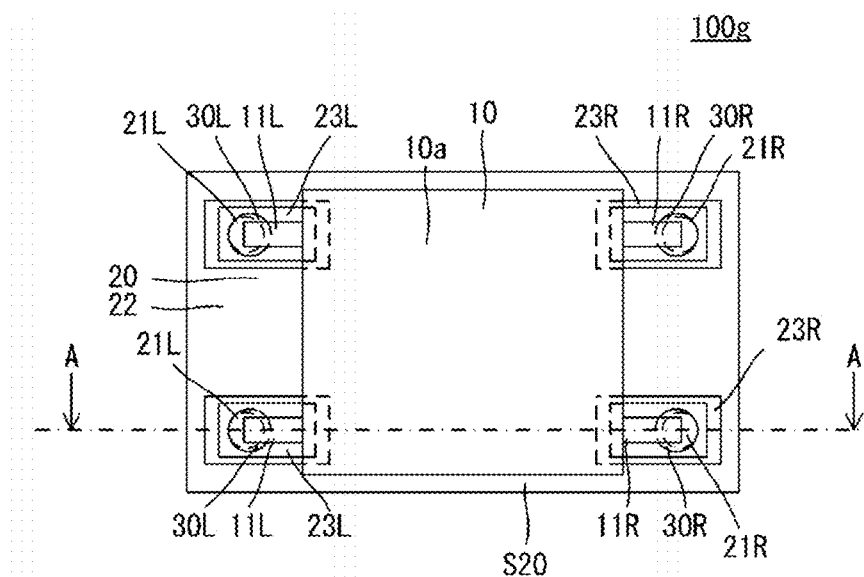
FIG. 21 is a plan view of a circuit module 100g according to a seventh modified example of a preferred embodiment of the present invention.
Figure 22:
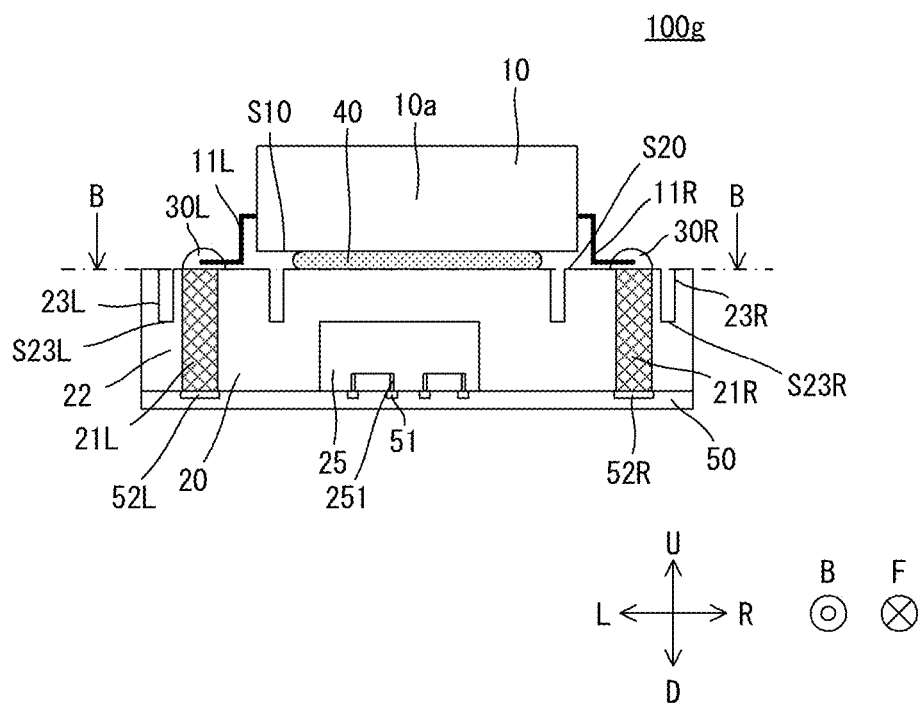
FIG. 22 is a cross-sectional view of the circuit module 100g according to the seventh modified example taken along line A-A.
Figure 23:
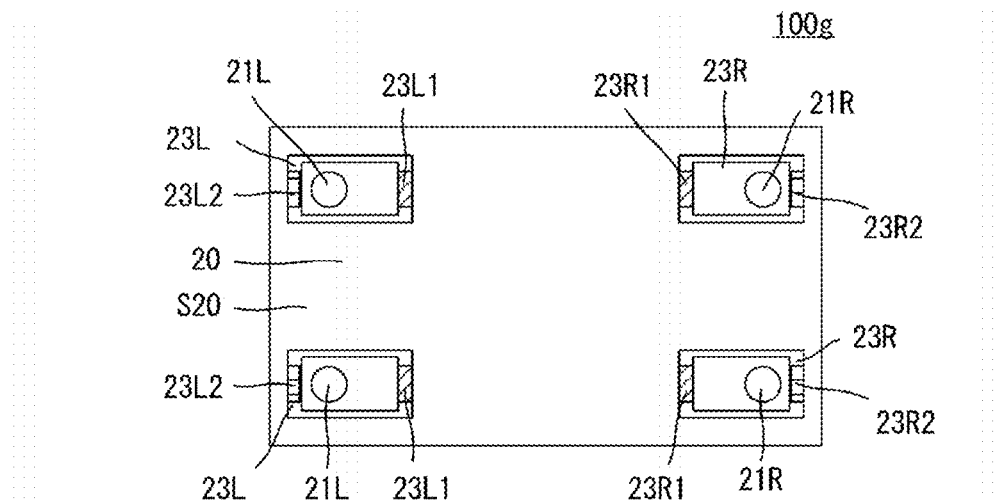
FIG. 23 is a cross-sectional view of the circuit module 100g according to the seventh modified example taken along line B-B.
Figure 23:
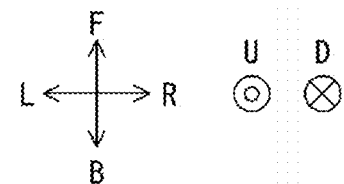

A circuit module 100g according to a seventh modified example of a preferred embodiment of the present invention will be described below with reference to the drawings. FIG. 21 is a plan view of the circuit module 100g according to the seventh modified example. FIG. 22 is a cross-sectional view of the circuit module 100g according to the seventh modified example taken along line A-A. FIG. 23 is a cross-sectional view of the circuit module 100g according to the seventh modified example taken along line B-B. Only the portions of the circuit module 100g according to the seventh modified example that are different from the corresponding portions of the circuit module 100c according to the third modified example will be described, and the other portions will not be described.

The circuit module 100g differs from the circuit module 100c in the configuration of the first recess 23R. More specifically, as illustrated in FIGS. 21 to 23, the distance between the first area 23R1 and the second electrode 21R in the lateral direction is longer than the distance between the second area 23R2 and the second electrode 21R in the lateral direction. In the present modified example, as illustrated in FIG. 23, the distance between the first area 23R1 and the second electrode 21R in the lateral direction and the distance between the second area 23R2 and the second electrode 21R in the lateral direction are different. In this case, the minimum distance between the first area 23R1 and the second electrode 21R in the lateral direction is longer than the minimum distance between the second area 23R2 and the second electrode 21R in the lateral direction. In this case, the distance of a portion between the first area 23R1 and the second electrode 21R in the lateral direction may be longer than the distance of a portion between the second area 23R2 and the second electrode 21R in the lateral direction.

The circuit module 100g with the above structure also has the same or substantially the same advantageous effects as the circuit module 100c. The circuit module 100g further prevents the solder portion 30R from spreading to the left of the second electrode 21R.

Eighth Modified Example

Figure 24:
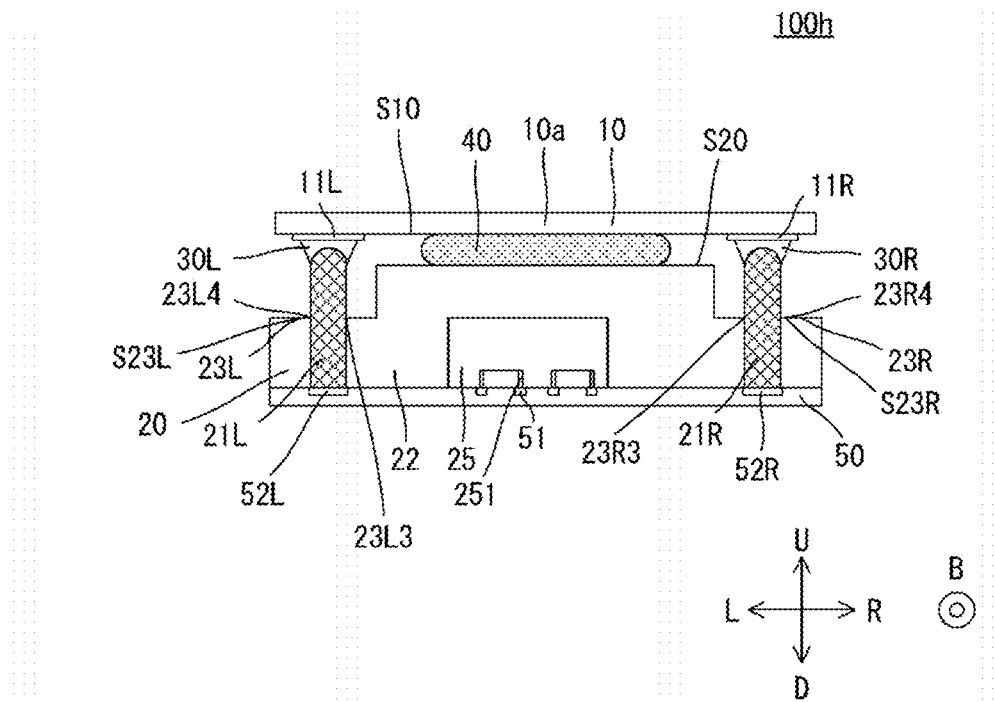
FIG. 24 is a cross-sectional view of a circuit module 100h according to an eighth modified example of a preferred embodiment of the present invention taken along line A-A.
Figure 24:
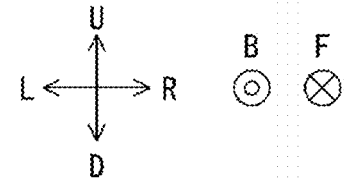

A circuit module 100h according to an eighth modified example of a preferred embodiment of the present invention will be described below with reference to the drawings. FIG. 24 is a cross-sectional view of the circuit module 100h according to the eighth modified example taken along line A-A. Only the portions of the circuit module 100h according to the eighth modified example that are different from the corresponding portions of the circuit module 100 according to the first preferred embodiment will be described, and the other portions will not be described.

The circuit module 100h differs from the circuit module 100 in the shape of the first recess 23R, the configuration of the electronic component 10, the shape of the electronic component 10, the configuration of the first electrode 11R, the shape of the first electrode 11R, and the shape of the second electrode 21R.

As illustrated in FIG. 24, the right end portion of the first recess 23R extends to the right side of the upper main surface S20.

As illustrated in FIG. 24, the electronic component 10 is disposed over the substrate module 20. The electronic component body 10a includes a portion that overlaps the second electrode 21R when viewed in the vertical direction. In the present modified example, the electronic component 10 is, for example, a substrate.

As illustrated in FIG. 24, the first electrode 11R is disposed below the bottom surface S10 of the electronic component body 10a. The first electrode 11R is in contact with the bottom surface S10 of the electronic component body 10a. The first electrode 11R may be disposed at the lower portion of the electronic component body 10a, and may be in contact with the bottom surface S10 of the electronic component body 10a.

As illustrated in FIG. 24, the upper end portion of the second electrode 21R is tapered. Specifically, a cross section of the second electrode 21R taken perpendicular or substantially perpendicular to the vertical direction decreases as it extends upward. In the cross section of the second electrode 21R taken perpendicular or substantially perpendicular to the vertical direction, a cross section of the upper portion of the second electrode 21R taken perpendicular or substantially perpendicular to the vertical direction entirely overlaps the cross section of the lower portion of the second electrode 21R taken perpendicular or substantially perpendicular to the vertical direction when viewed in the vertical direction.

The circuit module 100h with the above structure also has the same or substantially the same advantageous effects as the circuit module 100. In the circuit module 100h, the adhesion state of the solder portion 30R can be visually inspected when viewed from the right. The circuit module 100h further prevents the solder portion 30R from spreading to the left of the second electrode 21R. In the circuit module 100h, regardless of when the positions of the lower ends of the multiple first electrodes 11R in the vertical direction and the positions of the lower ends of the multiple first electrodes 11L in the vertical direction vary, and the positions of the upper ends of the multiple second electrodes 21R in the vertical direction and the positions of the upper ends of the multiple second electrodes 21L in the vertical direction vary, the multiple solder portions 30R and the multiple solder portions 30L allow the electronic component 10 to be horizontally disposed.

Ninth Modified Example

Figure 25:
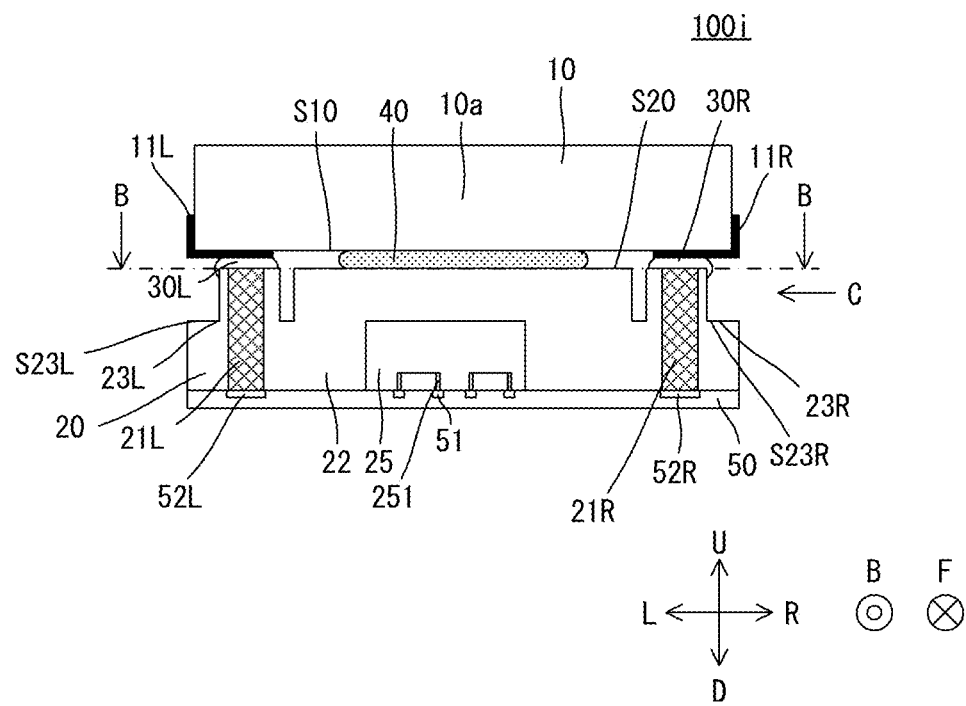
FIG. 25 is a cross-sectional view of a circuit module 100i according to a ninth modified example of a preferred embodiment of the present invention taken along line A-A.

A circuit module 100i according to a ninth modified example of a preferred embodiment of the present invention will be described below with reference to the drawings. FIG. 25 is a cross-sectional view of the circuit module 100i according to the ninth modified example taken along line A-A. Only the portions of the circuit module 100i according to the ninth modified example that are different from the corresponding portions of the circuit module 100a according to the first modified example will be described, and the other portions will not be described.

The circuit module 100i differs from the circuit module 100a in the shape of the first recess 23R. More specifically, as illustrated in FIG. 25, the insulating sealant 22 is provided at the upper end portion of the second electrode 21R. Thus, the second electrode 21R is not in contact with the first recess 23R. Specifically, the first area 23R1 does not include the first portion 23R3 that is in contact with the second electrode 21R when viewed in the vertical direction. Thus, the first area 23R1 is spaced apart from the second electrode 21R in the lateral direction. The second area 23R2 does not include the second portion 23R4 that is in contact with the second electrode 21R when viewed in the vertical direction. Thus, the second area 23R2 is spaced apart from the second electrode 21R in the lateral direction.

The circuit module 100i with the above structure also has the same or substantially the same advantageous effects as the circuit module 100a. In the circuit module 100i, the adhesion state of the solder portion 30R can be visually inspected more easily when viewed from the right. More specifically, in the circuit module 100a, the adhesion state cannot be visually inspected easily when viewed from the position C as illustrated in FIG. 5 when the solder portion 30R and the second electrode 21R have a small color difference. In contrast, in the circuit module 100i, the adhesion state can be visually inspected easily when viewed from the position C as illustrated in FIG. 25 as the solder portion 30R and the insulating sealant 22 have a large color difference.

Tenth Modified Example

Figure 26:
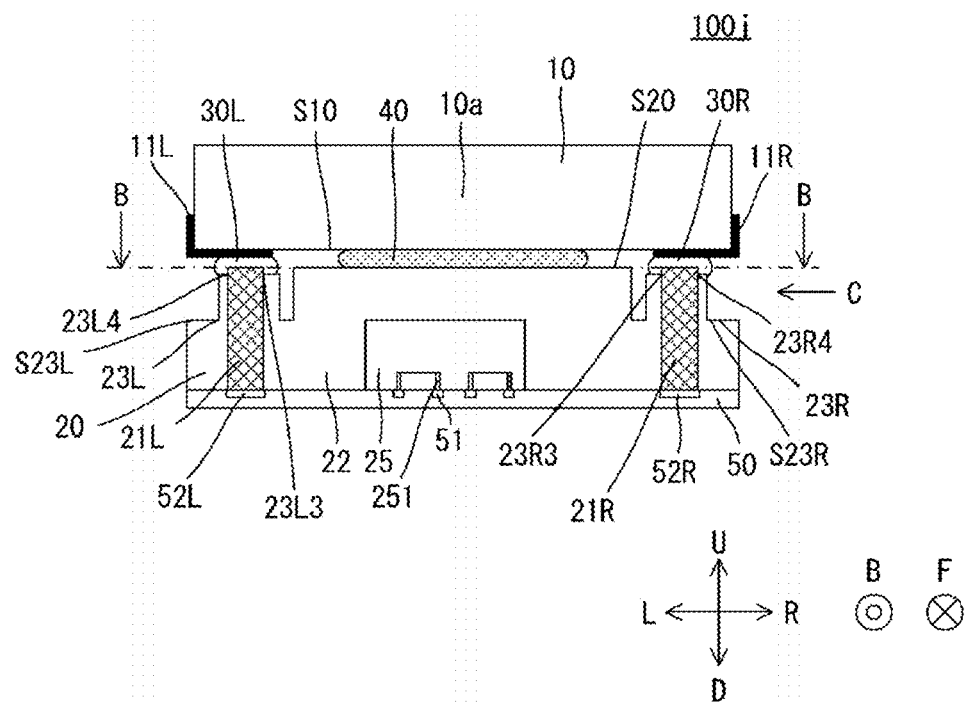
FIG. 26 is a cross-sectional view of a circuit module 100j according to a tenth modified example of a preferred embodiment of the present invention taken along line A-A.

A circuit module 100j according to a tenth modified example of a preferred embodiment of the present invention will be described below with reference to the drawings. FIG. 26 is a cross-sectional view of the circuit module 100j according to the tenth modified example taken along line A-A. Only the portions of the circuit module 100j according to the tenth modified example different from the corresponding portions of the circuit module 100i according to the ninth modified example will be described, and the other portions will not be described.

The circuit module 100j differs from the circuit module 100i in the shape of the first recess 23R. More specifically, as illustrated in FIG. 26, the insulating sealant 22 is not provided at the upper end portion of the second electrode 21R. Thus, in the present modified example, the first area 23R1 includes the first portion 23R3 that is in contact with the second electrode 21R when viewed in the vertical direction. Specifically, the first recess 23R is in contact with the left portion of the second electrode 21R. The second area 23R2 includes the second portion 23R4 that is in contact with the second electrode 21R when viewed in the vertical direction. Specifically, the first recess 23R is in contact with the right portion of the second electrode 21R.

The circuit module 100j with the above structure also has the same or substantially the same advantageous effects as the circuit module 100i.

Other Preferred Embodiments

Instead of the circuit modules 100 and 100a to 100j, a circuit module according to the present invention may be changed within the scope of the gist of the present invention. The components in the circuit modules 100 and 100a to 100j may be combined as appropriate.

The electronic component 10 may not be an inductor. For example, the electronic component 10 may be a capacitor or a substrate.

An electronic component may include only one first electrode 11R.

An electronic component may include only one first recess 23R, only one first recess 23Ra, and/or only one second recess 23Rb.

The bottoms S23R, S23Ra, and S23Rb may be different from surfaces. The bottoms S23R, S23Ra, and S23Rb may be lines or points.

The position of the upper end of the second electrode 21R may be above, below, or level with the upper end of the upper main surface S20 or the average position of the upper main surface S20 in the vertical direction.

The electronic component body 10a may partially or entirely overlap the second electrode 21R when viewed in the vertical direction.

The first recess 23R, the first recess 23Ra, and/or the second recess 23Rb may partially overlap the bonding adhesive 40 when viewed in the vertical direction.

The second electrode 21R may be in contact with the first recess 23Ra and the second recess 23Rb. In this case, the first area 23R1 includes the first portion 23R3 that is in contact with the second electrode 21R when viewed in the vertical direction. The second area 23R2 includes the second portion 23R4 that is in contact with the second electrode 21R when viewed in the vertical direction. The position of the first portion 23R3 in the vertical direction may be located above the position of the second portion 23R4 in the vertical direction. Alternatively, the position of the upper end of the first portion 23R3 in the vertical direction may be above the position of the upper end of the second portion 23R4 in the vertical direction, or the position of a certain point of the first portion 23R3 in the vertical direction may be above the position of a certain point of the second portion 23R4 in the vertical direction. This modification also has the same or substantially the same advantageous effects as the circuit module 100f.

The distance between the first area 23R1 of the first recess 23Ra and the second electrode 21R in the lateral direction may be longer than the distance between the second area 23R2 of the second recess 23Rb and the second electrode 21R in the lateral direction. Alternatively, the shortest distance between the first area 23R1 and the second electrode 21R in the lateral direction may be longer than the shortest distance between the second area 23R2 and the second electrode 21R in the lateral direction, or the distance of a portion between the first area 23R1 and the second electrode 21R in the lateral direction may be longer than the distance of a portion between the second area 23R2 and the second electrode 21R in the lateral direction. This modification also has the same effects as the circuit module 100g.

The insulating sealant 22, the IC 25, the solder portions 30R, and the substrate 50 may be omitted.

The insulating sealant 22 may be made of a material other than resin. The insulating sealant 22 may be, for example, ceramic. The substrate module 20 may be other than a combination of the substrate 50 and the insulating sealant 22. Thus, the substrate module 20 may include the substrate 50 without including the insulating sealant 22. The substrate 50 may be, for example, a ceramic substrate, or a glass epoxy substrate. In this case, the upper main surface S20 defines and functions as the upper main surface of the substrate 50.

The first conductors 51 may be in contact with the second conductors 52R. Specifically, the IC 25 may be electrically connected to the first electrode 11R and the second electrode 21R through the first conductors 51 and the second conductors 52R, respectively.

The IC 25 is not limited to a power-supply IC. The IC 25 may be, for example, a control IC, or an electronic component such as a resistor, a capacitor, or a diode.

The multiple second conductors 52R do not necessarily have to be linearly arranged in the front-rear direction at the right portion on the upper main surface of the substrate 50.

The first area 23R1 and the second area 23R2 do not necessarily have to be the areas where the first recess 23R and the second electrode 21R overlap when viewed in the lateral direction. The bonding adhesive 40, the first area 23R1, and the second electrode 21R may only have to be linearly arranged in this order when viewed in the vertical direction. The bonding adhesive 40, the second electrode 21R, and the second area 23R2 may only have to be linearly arranged in this order when viewed in the vertical direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module, comprising:
a substrate module including an upper main surface with a normal line extending in a vertical direction;
an electronic component on the substrate module; and
a bonding adhesive to fix the electronic component to the upper main surface; wherein
the electronic component includes a first electrode;
the substrate module includes a second electrode on a side of the bonding adhesive;
the first electrode is electrically connected to the second electrode by solder;
a first recess recessed downward and including a bottom is in the upper main surface;
an upper end of the second electrode is above the bottom;
the first recess includes a first area;
when viewed in the vertical direction, the first area is between the second electrode and the bonding adhesive; and
a material of the first recess is identical to a material of the upper main surface.

2. The circuit module according to claim 1, wherein the first recess includes a second area on a side of the second electrode when viewed in the vertical direction.

3. The circuit module according to claim 1, wherein the first recess is on a side of the second electrode.

4. The circuit module according to claim 1, wherein the first area is spaced apart from the second electrode in a lateral direction perpendicular or substantially perpendicular to the vertical direction.

5. The circuit module according to claim 1, wherein
the first recess further includes a second area on a side of the second electrode when viewed in the vertical direction; and
the second area is spaced apart from the second electrode in a lateral direction perpendicular or substantially perpendicular to the vertical direction.

6. The circuit module according to claim 2, wherein
the first area includes a first portion that is in contact with the second electrode;
the second area includes a second portion that is in contact with the second electrode; and
a position of the first portion in the vertical direction is above a position of the second portion in the vertical direction.

7. The circuit module according to claim 3, wherein
a second recess recessed downward and including a bottom is provided in the upper main surface;
the second recess further includes a second area on a right side of the second electrode when viewed in the vertical direction; and
a material of the second recess is identical to the material of the upper main surface.

8. The circuit module according to claim 5, wherein
the first area is spaced apart from the second electrode in the lateral direction; and
a distance between the first area and the second electrode in the lateral direction is longer than a distance between the second area and the second electrode in the lateral direction.

9. The circuit module according to claim 7, wherein the second area is spaced apart from the second electrode in a lateral direction perpendicular or substantially perpendicular to the vertical direction.

10. The circuit module according to claim 7, wherein
the first area includes a first portion in contact with the second electrode;
the second area includes a second portion in contact with the second electrode; and a position of the first portion in the vertical direction is above a position of the second portion in the vertical direction.

11. The circuit module according to claim 9, wherein the first area is spaced apart from the second electrode in the lateral direction; and a distance between the first area and the second electrode in the lateral direction is longer than a distance between the second area and the second electrode in the lateral direction.

12. The circuit module according to claim 1, wherein an upper end portion of the second electrode is tapered.

13. The circuit module according to claim 1, wherein the electronic component includes an electronic component body; and the electronic component body partially overlaps the second electrode when viewed in the vertical direction.

14. The circuit module according to claim 1, wherein the substrate module further includes a substrate; and a bottom surface of the second electrode is in contact with a top surface of the substrate.

15. The circuit module according to claim 1, wherein the substrate module further includes:

a resin; and an integrated circuit; wherein the resin covers a lower portion of the second electrode and the integrated circuit; and the resin includes the upper main surface.

16. The circuit module according to claim 1, wherein at least a portion of the first area defines an open area between the second electrode and the substrate module.

17. The circuit module according to claim 2, wherein the second area is on a right side of the second electrode when viewed in the vertical direction, and extends to a right edge of the upper main surface.

* * * * *